United States Patent [19]

Brownlow et al.

[11] Patent Number: 4,474,731

[45] Date of Patent: Oct. 2, 1984

[54] PROCESS FOR THE REMOVAL OF CARBON RESIDUES DURING SINTERING OF CERAMICS

[75] Inventors: James M. Brownlow, Crompond; Thomas S. Plaskett, Katonah, both of N.Y.

[73] Assignee: International Business Machines Corporation, Armonk, N.Y.

[21] Appl. No.: 479,591

[22] Filed: Mar. 28, 1983

[51] Int. Cl.³ .......................... B01J 23/62; B01J 23/74
[52] U.S. Cl. ............................. 419/5; 75/235; 264/63
[58] Field of Search ................. 75/235; 419/5; 264/63

[56] References Cited
U.S. PATENT DOCUMENTS 3,907,710 9/1975 Lundsager ...................... 423/213.5
4,193,793 3/1980 Cheung ............................... 75/235

Primary Examiner—Leland A. Sebastian
Attorney, Agent, or Firm—Sughrue, Mion, Zinn, Macpeak and Seas

[57] ABSTRACT

A process is described for the sintering and densification of ceramic materials containing hydrocarbon materials to produce ceramic bodies substantially free from carbonaceous residues of such hydrocarbon materials by compacting ceramic particles and a binder containing a pyrolysis catalyst selected from the group consisting of nickel and palladium ions, heating in a low oxygen atmosphere to a temperature in the range of 350° to 780° C. to remove the carbonaceous residue and further heating the material to produce a sintered, dense ceramic body.

31 Claims, 2 Drawing Figures 4,474,731

PROCESS FOR THE REMOVAL OF CARBON RESIDUES DURING SINTERING OF CERAMICS

TECHNICAL FIELD

This invention relates to a process for removing carbonaceous residues from ceramic materials so that upon sintering there is produced a sintered, dense ceramic substantially free from such residues.

In the manufacture of ceramic articles for use in electronic devices, as well as in other end use applications, ceramic articles are often fabricated by mixing ceramic powder with a suitable binder, e.g., a polymeric binder, molding to the desired shape and then firing to sinter and densify the ceramic and, concurrently to drive off the polymeric binder.

Such fabrication techniques are used in a number of industries including the electronics industry. Where relatively high sintering temperatures can be employed substantially all of the binder will ordinarily be driven off during the sintering or pre-sintering heating stages and a sintered, dense ceramic article, free from carbonaceous residues, will be obtained.

In the electronics industry, such fabrication techniques are used to produce ceramic bodies containing conductive pathways. For example, a mixture of an alumina ceramic powder and a polymeric binder powder may be combined with a pattern of a mixture of conductive powdered metal and binder, so that the ceramic substantially surrounds or encapsulates the powdered metal pattern. Typical metals used in forming such composites include, e.g., Mo, Ni, Co, Cu, etc.

The presence of the pattern of conductive metal powder in the unsintered ceramic/metal powder composite makes it necessary to conduct sintering in atmospheres low in oxygen in order to minimize oxidation of the metal. In the case of copper, atmospheres are used which, at 950° C., contain hydrogen and water vapor (steam) in ratios of $H_2/H_2O$ of from about $5 \times 10^{-4}$ to $5 \times 10^{-2}$ in order to minimize the oxidation problem. A $H_2/H_2O$ ratio of 0.0005 is produced by introducing 99.95% $H_2O$ as steam.

Usually, in processing such molded composites of powdered ceramic and powdered metal to produce sintered, dense composite articles, a first pre-sintering heating stage is employed to drive off any polymeric binders used to assist in molding the powders. However, where a low oxygen atmosphere must be employed for any reason, e.g., to avoid oxidation of the metal, incomplete removal of carbonaceous materials from the binder component is experienced. Thereafter, when the sintering and densification heating cycle is completed, rather than obtaining a white ceramic, a black ceramic is obtained. The carbon remaining in the ceramic can form conduction paths which lead to lower insulation resistance by many orders of magnitude and to increased dielectric losses.

PRIOR ART

Prior to this invention, the problem of blackened ceramic articles could only be overcome by slow firing in an atmosphere of 100% steam. This technique is undesirable or unsatisfactory because a hold time of several hours, e.g., 4 to 6 hours, is required to burn off carbon at ~750° C., a narrow range of atmospheres is used $H_2/H_2O = 5$ to $10 \times 10^{-4}$, and specialized equipment is required to handle the ~99.95% $H_2O$, steam, at 100° C., which increases capital costs.

U.S. Pat. No. 3,808,041 describes the application of metal compounds dissolved in an organic varnish onto semiconductor substrates and the subsequent removal of the varnish and conversion of the metal compounds to metal by heating at 350°–400° C. in an oxygen/argon atmosphere.

Representative patents describing the manufacture of electronic devices using ceramic powder to form an insulating matrix on which and within which metallized conductive patterns are produced include U.S. Pat. Nos. 3,074,143, Smith, 3,520,054, Pensack et al, and 4,080,414. Anderson et al. These patents generally disclose the removal of binder by heating the green ceramic.

However, none of the foregoing references provides a satisfactory process for the substantially complete removal of carbonaceous residues, such as, binder residues, from ceramic powders by heating at relatively low temperatures in a low oxygen atmosphere.

SUMMARY OF THE INVENTION

Now, in accordance with the present invention, composite articles may be fabricated from mixtures of ceramic powders and metal powders wherein a polymeric binder is employed in a fashion which permits substantially complete removal of the binder and any carbonaceous residue of the binder is a pre-sintering heating step. This result is accomplished by heating the ceramic and binder composition in a low oxygen atmosphere at a temperature in the range of about 350°–780° C. in the presence of nickel and/or platinum ions for a time sufficient to catalytically pyrolyze and drive off substantially all of the carbon residues in the ceramic.

DETAILED DESCRIPTION OF THE PREFERRED EMBODIMENT OF THE INVENTION

This invention provides an effective method of producing sintered, dense ceramics substantially free from carbonaceous residues by a process comprising heating the ceramic prior to sintering at a temperature in the range of from about 350° to 780° C. in an atmosphere which is low in oxygen and in the presence of from about 1% to 5% by weight of the ceramic of nickel ions and/or platinum ions.

This invention may be applied to any ceramic or glassy material which may be detrimentally affected by carbonaceous residues and which for some reason cannot or should not be subjected to heating in high oxygen content atmospheres to pyrolyze the carbonaceous residues.

Typical ceramic or glassy materials include, for example, and without limitation, PYREX and E glass which have the following formulations:

| mol % | PYREX | E Glass |
| --- | --- | --- |
| SiO$_2$ | 85 | 60 |
| Al$_2$O$_3$ | 1 | 14 |
| B$_2$O$_3$ | 10 | 15 |
| CaO |  | 11 |
| Na$_2$O | 4 |  |

In order to mold electronic devices of the desired shape and dimensions, the ceramic powder is generally mixed with vehicle and binder materials to form a viscous slurry which can be shaped, molded, rolled, cut, etc., into the desired configuration. Vehicles and binders which are used for this purpose include a wide variety of organic materials.

Binders used successfully include Butvar B98, Butvar B98 with BENZOFLEX, starch, polyvinyl alcohol (Polysciences Cat. #4324), and acrylic resin (Dupont ELVACITE 2044).

We believe almost all carbon, hydrogen, oxygen, nitrogen based organics and polymers will respond to nickel and palladium catalytic action.

The nickel ions and palladium ions may be added as compounds, such as, nickel acetyl acetonate, which is about 15% by weight NiO (assay), nickel acetate, palladium nitrate (Pd(NO$_3$)$_2$), etc. The nickel and/or palladium ions are preferably added to the polymer binder by solution therein prior to preparation of the ceramic powder mixtures. From about 1% to 5% by weight of metal oxide based upon the dry weight of the polymer binder has been found to be effective. We have also tried Ti, Zr, Cr, Mn, Fe, Ca and Mg ions but have not found them to be satisfactory.

Metal powders which can be used in forming the conductive pathways of composites which may be made by use of this invention include any metal capable of being provided in powdered form and providing a suitably conductive region in the end product. Mo, Co, Ni, Cu, W, Ag, etc., are examples of suitable metals. The metal powder should have a particle size in the range of from about 0.1 to 10 microns. Any suitable binder may be used for the metal powders, e.g., ethyl cellulose dissolved in butyl carbitol 7.5 to 14%.

Figure 1:
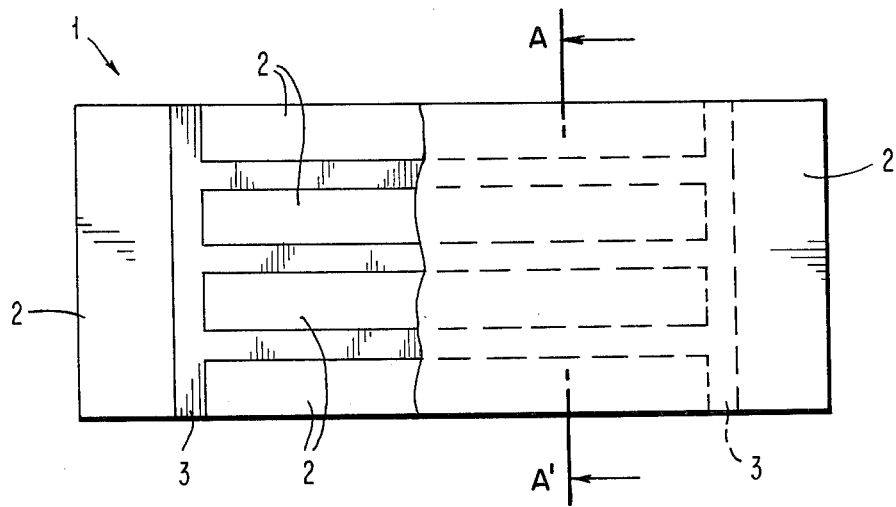
FIG. 1 is a plan view of a compact of ceramic and metal powders and associated polymeric binder suitable for processing in accordance with this invention, with the upper layer of ceramic shown partially cut away.

With reference to the drawing, FIG. 1 is a plan view of a composite ceramic and metal article 1 comprising a body of insulating ceramic material 2 containing a pattern of conductive metallic material 3. The conductive pattern of metal 3 is indicated by dotted lines as lying beneath the ceramic 2. The left portion of the upper layer of ceramic 2 is shown cut-away to reveal the conductive material 3, shown in solid lines in the cutaway portion of FIG. 1. In accordance with the invention, nickel ions and/or palladium ions are incorporated into the polymer which is used as a binder for the ceramic powders which are sintered to form the dense body of ceramic insulating material.

Figure 2:
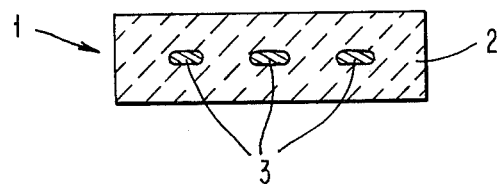
FIG. 2 is a schematic cross-sectional view of the compact of FIG. 1 along line A-A'.

FIG. 2 is a cross-section taken along line A—A' of FIG. 1 of the drawing and shows the pattern of conductive material 3 encapsulated within the sintered body of ceramic material 3 which, in accordance with the invention, is rendered substantially free of carbonaceous residue from the organic binder, or any other organic carbon containing materials, such as, plasticizers, vehicles, etc., which may be used in preparing the ceramic powder mixture.

As examples of the preferred mode for practicing the present invention composite ceramic and metal articles were prepared as described below:

A. Materials—The materials used in the following examples were as follows:

1. The ceramic used was a powder of a glass near the approximate composition of the mineral cordierite:
  SiO$_2$ about 50 mol%
  Al$_2$O$_3$ about 25 mol%
  MgO about 25 mol%
with additions of B$_2$O$_3$ and P$_2$O$_5$ to make up to as much as 5 mol% of the glass.

2. The binder used was a mixture by weight of 75% BUTVAR B98 and 25% BENZOFLEX.

3. The solvent used was a mixture by weight of 75% methyl isobutyl ketone (MIBK) and 25% methanol (MeOH).

4. The catalysts used were (a) nickel acetyl acetonate, Ni(C$_5$H$_3$O$_2$)$_2$, whcih is about 15% by weight NiO (assay), (b) nickel acetate, (c) Pd(NO$_3$)$_2$.

B. Methods—The method used in the following examples were as follows:

1. The binders, solvents and catalysts are mixed by stirring with an impeller or magnetic stir bar. The glass powder is added and stirred for 30 minutes to form a slurry. The slurry is spread on Mylar with a blade to form a sheet 10 to 15 mils thick when dry. The ceramic green sheet is separated from the Mylar and hot laminated several sheets thick at 95° C. and about 4,000 lb per sq. inch. (If this was to be a metallized multilayer part, metal powder paste patterns would have been printed on the sheets and through holes in the sheets prior to lamination.)

2. Firing of the ceramic was done in a tube furnace through which gases could be passed. Nitrogen and hydrogen were mixed and saturated with water by passing through an H$_2$O bath held at 55° C. which adds 15.3% water to the mixture. At 950° the H$_2$/H$_2$O was 0.038.

3. The temperature was raised continuously to 780° C. in 6 hours (no hold at 780° C.) and then to 950° C. in 3 hours and held at 950° C. for one hour. The parts were cooled to room temperature in 30 minutes in the protective gas.

4. The electrical resistance, ohms per square, was measured at 20 V.D.C. after 10 mils of the surface was sanded off. The surface skin is more oxidized than the interior.

5. The dissipation factor, D, at 1 Kc and the dielectric Q at 1 mc were measured between electrodes on opposed sanded surfaces.

6. Copper Paste Process—A copper paste process was used to provide the conductive pathways in the composites formed in the examples. According to the copper paste process, 85% copper powder, 0.1 to 1 micron particle size, was mixed with 1.8 ethyl cellulose, and 13.2% butyl carbitol.

The binder and solvent were stirred with heating to 70° C. to form a solution. The solution and copper powder were mixed thoroughly with a spatula and the resulting mixture was spread on a TEFLON (DuPont) surface to form a sheet 5 to 7 mils thick. This sheet was dried at 80° C. Sheets were separated with a knife and can then be cut and interlayered in patterns between ceramic sheets during lamination.

The pattern of copper paste co-fires with the ceramic to become dense copper metal.

EXAMPLES

Using the materials and procedures described above materials were prepared in accordance with this invention as described in Examples 1–7. The formulations of the examples are summarized in Table 1 as follows:

TABLE 1

| Ex. No. | Solvents MIBK gm | Solvents MeOH gm | Binder B98 BUTVAR gm | Binder BENZO-FLEX gm | Catalysts Nickel hexanoate gm | Catalysts Nickel acetate gm | Glass gm |
|---|---|---|---|---|---|---|---|
| 1 | 55.8 | 18.5 | 10.8 | 3.6 | 0 | 0 | 130.6 |
| 2 | 55.8 | 18.5 | 5.4 | 1.8 | 0 | 0 | 137.8 |
| 3 | 55.8 | 18.5 | 9.79 | 3.26 | 1.35 | 0 | 130.6 |
| 4* | 55.8 | 18.5 | 4.76 | 1.59 | 0 | 0.6 | 137.5 |
| 5 | 55.8 | 18.5 | 4.76 | 1.59 | 1.76 | 0 | 138.7 |
| 6 | 55.8 | 18.5 | 4.76 | 1.59 | 0.6 | 0 Palladium nitrate $Pd(NO_3)_2$ | 137.5 |
| 7 | 55.8 | 18.5 | 4.76 | 1.59 | 0.5 gm | | 138.7 |

*0.3 cc of $NH_4OH$ was added to Example 4 to neutralize the Ni acetate.

EXAMPLE 1

Ceramic sheets were made using proportions shown for Example No. 1 in Table 1. This produced a body having 5% resin based on ceramic weight and no Ni catalyst. The material was fired in air and the sintered product was white in color. The resistance of the product was over $10^{13}$ ohms/square, the dissipation factor D was <0.02, and the dielectric Q was 245. These are desirable dielectric properties to which other examples are to be compared.

The same green laminate of composition 1 when fired in an atmosphere of $H_2/H_2O$ ratio at 950° of 0.038, without nickel or palladium ions, produced a black ceramic with a resistance of $10^4$ ohms/square, a D=30, and a Q=60. These are very poor and unusable electrical properties.

EXAMPLE 2

A sample was made according to proportions shown for Example No. 2, Table 1, which had 10% resin and no catalyst. It was fired in $H_2/H_2O=0.038$ and gave a sintered product that had poor dielectric properties and was black. See Table 2 for the results.

EXAMPLE 3

A sample 3 was made according to proportions shown for Example No. 3 in Table 1 producing a resin % of 10 and incorporating 0.9% NiO as nickel hexanoate. It was fired in $H_2/H_2O=0.038$ at 950° C. The sintered product had a resistance of $10^9$ ohms/square, a D=0.5 and a Q=230. The product was grey in color.

EXAMPLE 4

A sample was made with the proportions shown for Example No. 4 in Table 1. This contained 5% resin and 1.29% NiO. The material was fired in $H_2/H_2O=0.038$ and the resulting product was white. The dielectric properties were as good as the air fired example, i.e., resistance was >$10^{13}$ ohms/square, D was <0.02, and Q=245.

In Table 2 results are shown for repetitions of Example 4 varying the $H_2/H_2O$. The dielectric properties are given and it will be seen that they are not dependent on the $H_2/H_2O$ ratio at 950° C. between 0.038 and 0.0005.

TABLE 2

RESULTS OF EXAMPLE 4

| % Resin | % NiO | $H_2/H_2O$ | Color | Log R | D 1 kc | Q 1 mc |
|---|---|---|---|---|---|---|
| 5 | 1.29 | 0.038 | W | >13 | <0.02 | 245 |
| 5 | 1.29 | 0.03 | W | " | " | " |
| 5 | 1.29 | 0.003 | W | " | " | " |
| 5 | 1.29 | 0.0005 | W | " | " | " |
| 5 | 1.29 | AIR | W | " | " | " |

Note to TABLE 2:
W = white in color.

EXAMPLE 5

A sample was made according to proportions shown for Example No. 5 in Table 1. It contained 5% resin and 2.59% NiO. The material was fired to 950 in $H_2/H_2O=0.038$. The sintered product was white and had good electrical properties, i.e., a resistance >$10^{13}$ ohms/square, a D <0.02, and a Q=245.

EXAMPLE 6

A sample was made using proportions shown for Example No. 6 in Table 1. The material contained 5.85% resin, and 3.25% NiO. It was fired to 950° in $H_2/H_2O=0.038$. The product was white. It had >$10^{13}$ ohms/square, D <0.02, Q=245. NiO dissolves in the ceramic and has no adverse effect on dielectric properties.

EXAMPLE 7

A sample was made according to proportions shown for Example No. 7 of Table 1. The material was fired to 950° C. in a $H_2/H_2O$ ratio of 0.038. The product was white and had good electrical properties, i.e., a resistance of >$10^{13}$ ohms per square, a D <0.02 and Q=245. This demonstrated that palladium is an active catalyst for the purposes of this invention, as is nickel.

Data concerning the composition and properties of materials resulting from Examples 1–7 are presented in Table 3.

TABLE 3

| Example | % Resin | % PdO | % NiO | Gas | Color | LogR | D | Q |
|---|---|---|---|---|---|---|---|---|
| 1 | 5 | | 0 | air | W | §13 | <0.02 | 245 |
| 1 | 5 | | 0 | $H_2/H_2O$ | B | 4 | 20 | 60 |
| 2 | 10 | | 0 | $H_2/H_2O$ | B | 7 | 6 | 85 |
| 3 | 10 | | 0.9 | $H_2/H_2O$ | G | 9 | 0.5 | 230 |

TABLE 3-continued

| Example | % Resin | % PdO | % NiO | Gas | Color | LogR | D | Q |
|---|---|---|---|---|---|---|---|---|
| 4 | 5 | | 1.29 | $H_2/H_2O$ | W | >13 | <0.02 | 245 |
| 5 | 5 | | 2.59 | $H_2/H_2O$ | W | >13 | <0.02 | 245 |
| 6 | 5.85 | | 3.25 | $H_2/H_2O$ | W | >13 | <0.02 | 245 |
| 7 | 5 | 4 | 0 | $H_2/H_2O$ | W | >13 | <0.02 | 245 |

Notes on the results of Table 3:
(a) Gas introduced at 55° C. was 0.6% $H_2$, 84.1 $N_2$, 15.3 $H_2O$ Water gas reaction at 950° C. gives $H_2/H_2O = 0.038$;
(b) % resin based on glass weight;
(c) % NiO based on binder plus nickel organic weight
(d) LogR; R = resistance as ohms/square;
(e) D = dissipation factor at 1 kc;
(f) Q = dielectric Q at 1 mc;
(g) W = white; G = grey; B = black.

While this invention has been described in connection with specific embodiments, it will be understood that those of skill in the art may be able to develop variations of the disclosed embodiments without departing from the spirit of the invention or the scope of the following claims.

Having thus described out invention, what we claim as new, and desire to secure by Letters Patent is:

1. A process for the sintering and densification of ceramic materials containing hydrocarbon materials in order to produce a sintered, dense ceramic body and substantially free from carbonaceous residues of said hydrocarbon materials comprising
   a. forming a compact of ceramic particles bonded together by a polymeric, hydrocarbon binder in which binder there is dissolved prior to sintering, a pyrolysis catalyst selected from the group consisting of nickel and palladium ions,
   b. heating said ceramic material in a low oxygen content atmosphere to a temperature in the range of from about 350° to 780° C., thereby substantially removing said carbonaceous residues from said compact, and
   c. further heating for a time and a temperature said compact to sinter and densify said ceramic material.

2. The process of claim 1, wherein said catalyst is present in an amount of from about 1% to 5% by weight of said ceramic material.

3. The process of claim 1, wherein said heating prior to sintering is conducted for a period of from about 7 to 12 hours.

4. The process of claim 1, wherein the gas composition of said low oxygen content atmosphere during said heating to remove said carbonaceous residues comprises an $H_2$ to $H_2O$ ratio in the range of from about $H_2/H_2O =$ about $5 \times 10^{-4}$ to about $5 \times 10^{-2}$.

5. The process of claim 4, wherein said heating to sinter and densify is also conducted in a low oxygen content atmosphere wherein the gas composition comprises an $H_2/H_2O$ less than $5 \times 10^{-2}$.

6. The process of claim 4, wherein said heating prior to sintering is conducted for a period of from 7 to 12 hours and said heating to sinter and densify is conducted at a temperature in the range of from 920° to 980° C., for a period of up to 1 hour.

7. The process of claim 1, wherein said ceramic materials are composited with one or more conductive metals.

8. The process of claim 7, wherein said metals are selected from the group consisting of Mo, Ni, Co, Cu, W, Ag.

9. The process of claim 7, wherein said metals are in powdered form prior to sintering and are arranged to form one or more conductive paths which are integrally bonded to said ceramic after sintering is completed.

10. The process of claim 1 wherein said ceramic material comprises, in most percentages, the major constituent, $SiO_2$, as substantial constituents, but not in excess of said $SiO_2$ content, $Al_2O_3$ and MgO, and as minor constituents, not more than about 5% of $B_2O_3$ and/or $P_2O_5$.

11. The process of claim 2 wherein said ceramic material comprises, in most percentages, the major constituent, $SiO_2$, as substantial constituents, but not in excess of said $SiO_2$ content, $Al_2O_3$ and MgO, and as minor constituents, not more than about 5% of $B_2O_3$ and/or $P_2O_5$.

12. The process of claim 3 wherein said ceramic material comprises, in most percentages, the major constituent, $SiO_2$, as substantial constituents, but not in excess of said $SiO_2$ content, $Al_2O_3$ and MgO, and as minor constituents, not more than about 5% of $B_2O_3$ and/or $P_2O_5$.

13. The process of claim 4 wherein said ceramic material comprises, in most percentages, the major constituent, $SiO_2$, as substantial constituents, but not in excess of said $SiO_2$ content, $Al_2O_3$ and MgO, and as minor constituents, not more than about 5% of $B_2O_3$ and/or $P_2O_5$.

14. The process of claim 5 wherein said ceramic material comprises, in most percentages, the major constituent, $SiO_2$, as substantial constituents, but not in excess of said $SiO_2$ content, $Al_2O_3$ and MgO, and as minor constituents, not more than about 5% of $B_2O_3$ and/or $P_2O_5$.

15. The process of claim 6 wherein said ceramic material comprises, in most percentages, the major constituent, $SiO_2$, as substantial constituents, but not in excess of said $SiO_2$ content, $Al_2O_3$ and MgO, and as minor constituents, not more than about 5% of $B_2O_3$ and/or $P_2O_5$.

16. The process of claim 7 wherein said ceramic material comprises, in most percentages, the major constituent, $SiO_2$, as substantial constituents, but not in excess of said $SiO_2$ content, $Al_2O_3$ and MgO, and as minor constituents, not more than about 5% of $B_2O_3$ and/or $P_2O_5$.

17. The process of claim 8 wherein said ceramic material comprises, in most percentages, the major constituent, $SiO_2$, as substantial constituents, but not in excess of said $SiO_2$ content, $Al_2O_3$ and MgO, and as minor constituents, not more than about 5% of $B_2O_3$ and/or $P_2O_5$.

18. The process of claim 9 wherein said ceramic material comprises, in most percentages, the major constituent, $SiO_2$, as substantial constituents, but not in excess of said $SiO_2$ content, $Al_2O_3$ and MgO, and as minor constituents, not more than about 5% of $B_2O_3$ and/or $P_2O_5$.

19. The process of claim 1 wherein said catalyst is a compound selected from the group consisting of nickel acetyl acetonate, nickel hexanoate, nickel acetate and palladium nitrate.

20. The process of claim 2 wherein said catalyst is a compound selected from the group consisting of nickel acetyl acetonate, nickel hexanoate, nickel acetate and palladium nitrate.

21. The process of claim 3 wherein said catalyst is a compound selected from the group consisting of nickel acetyl acetonate, nickel hexanoate, nickel acetate and palladium nitrate.

22. The process of claim 4 wherein said catalyst is a compound selected from the group consisting of nickel acetyl acetonate, nickel hexanoate, nickel acetate and palladium nitrate.

23. The process of claim 5 wherein said catalyst is a compound selected from the group consisting of nickel acetyl acetonate, nickel hexanoate, nickel acetate and palladium nitrate.

24. The process of claim 6 wherein said catalyst is a compound selected from the group consisting of nickel acetyl acetonate, nickel hexanoate, nickel acetate and palladium nitrate.

25. The process of claim 7 wherein said catalyst is a compound selected from the group consisting of nickel acetyl acetonate, nickel hexanoate, nickel acetate and palladium nitrate.

26. The process of claim 8 wherein said catalyst is a compound selected from the group consisting of nickel acetyl acetonate, nickel hexanoate, nickel acetate and palladium nitrate.

27. The process of claim 9 wherein said catalyst is a compound selected from the group consisting of nickel acetyl acetonate, nickel hexanoate, nickel acetate and palladium nitrate.

28. The process of claim 10 wherein said catalyst is a compound selected from the group consisting of nickel acetyl acetonate, nickel hexanoate, nickel acetate and palladium nitrate.

29. The process of claim 19 wherein said catalyst is nickel hexanoate in a concentration in the range of from about 9.3 to about 28% by weight of the said binder.

30. The process of claim 19 wherein said catalyst is nickel acetate in a concentration of from about 3.5 to about 11% by weight of said binder.

31. The process of claim 19 wherein said catalyst is palladium nitrate, $Pd(NO_3)_2$, in a concentration of from about 2.5 to about 7.9% by weight of said binder.

* * * * *

UNITED STATES PATENT AND TRADEMARK OFFICE
CERTIFICATE OF CORRECTION

PATENT NO. : 4,474,731
DATED : October 2, 1984
INVENTOR(S) : James M. Brownlow, Thomas Stanley Plaskett It is certified that error appears in the above-identified patent and that said Letters Patent is hereby corrected as shown below:

In column 2, line 35 and line 59, "platinum" should be

--palladium--.

Signed and Sealed this

Fifteenth Day of October 1985

[SEAL]

Attest:

Attesting Officer

DONALD J. QUIGG

Commissioner of Patents and Trademarks—Designate